(12) United States Patent
Saito

(10) Patent No.: US 9,345,129 B2
(45) Date of Patent: May 17, 2016

(54) MOUNTING STRUCTURE, ELECTRO-OPTICAL APPARATUS, AND ELECTRONIC APPARATUS

(71) Applicant: SEIKO EPSON CORPORATION, Tokyo (JP)

(72) Inventor: Hidetaka Saito, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 162 days.

(21) Appl. No.: 14/326,729

(22) Filed: Jul. 9, 2014

(65) Prior Publication Data
US 2015/0029680 A1 Jan. 29, 2015

(30) Foreign Application Priority Data
Jul. 26, 2013 (JP) .................................. 2013-155348

(51) Int. Cl.
*H05K 7/00* (2006.01)
*H05K 1/02* (2006.01)
*H05K 1/14* (2006.01)

(52) U.S. Cl.
CPC .............. *H05K 1/0269* (2013.01); *H05K 1/144* (2013.01); *H05K 2201/09918* (2013.01); *H05K 2203/166* (2013.01)

(58) Field of Classification Search
CPC ................ H05K 1/0269; H05K 1/144; H05K 2201/09918; H05K 2203/166

USPC ........... 361/748, 760, 777; 174/254, 255, 260
See application file for complete search history.

(56) References Cited

U.S. PATENT DOCUMENTS

| | | | | |
|---|---|---|---|---|
| 4,721,365 A | * | 1/1988 | Nishimura | G02F 1/1345 29/593 |
| 5,729,315 A | * | 3/1998 | Takahashi | G02F 1/1345 349/149 |
| 7,449,284 B2 | * | 11/2008 | Yang | B81C 1/00484 430/22 |
| 9,111,706 B2 | * | 8/2015 | Chen | G06F 3/041 |
| 2004/0063332 A1 | * | 4/2004 | Seko | H01L 21/563 438/734 |
| 2005/0218513 A1 | * | 10/2005 | Seko | H01L 21/563 257/734 |
| 2007/0040286 A1 | * | 2/2007 | Liu | H01L 23/544 257/797 |

FOREIGN PATENT DOCUMENTS

| | | |
|---|---|---|
| JP | A-8-152646 | 6/1996 |
| JP | A-2006-235503 | 9/2006 |
| JP | A-2007-11010 | 1/2007 |
| JP | A-2007-86276 | 4/2009 |

\* cited by examiner

*Primary Examiner* — Yuriy Semenenko
(74) *Attorney, Agent, or Firm* — Oliff PLC

(57) ABSTRACT

A mounting structure in which a plurality of substrates are electrically connected to each other includes a first substrate having a first alignment mark formed by partially cutting away a first terminal, and a second substrate having a second alignment mark formed by partially cutting away a second terminal. The first terminal and the second terminal are electrically connected to each other by being relatively positioned with respect to each other.

20 Claims, 12 Drawing Sheets

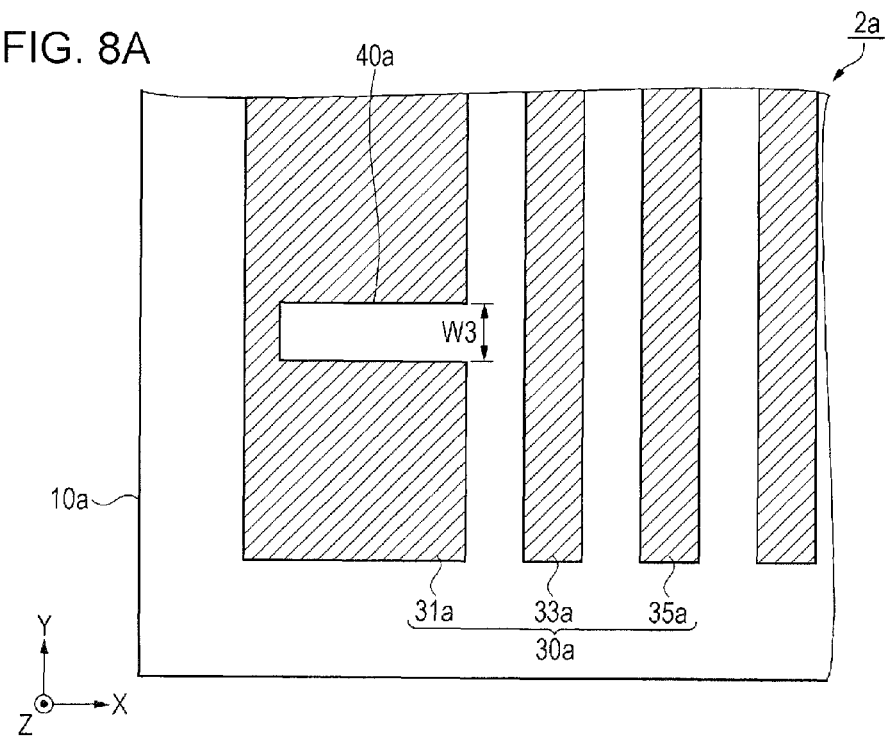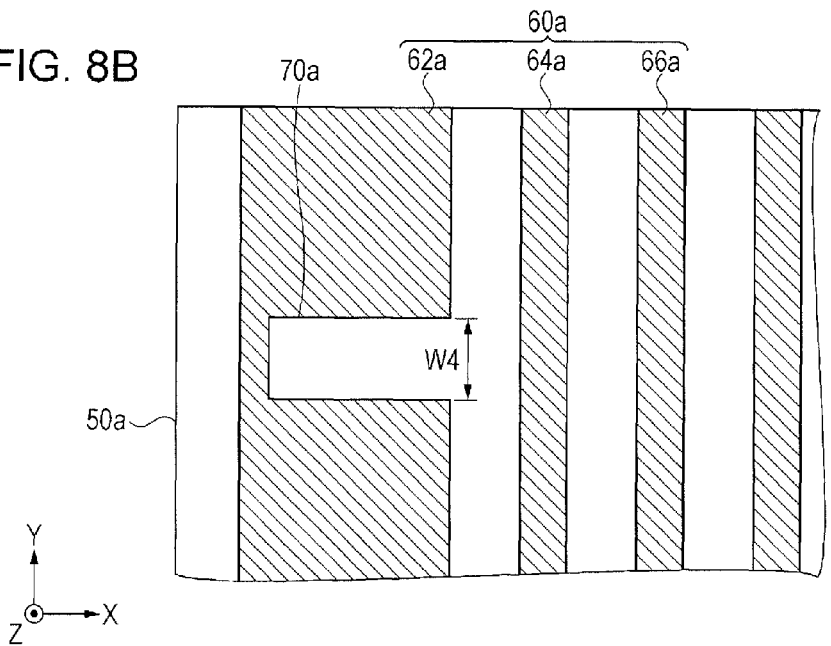

MOUNTING STRUCTURE, ELECTRO-OPTICAL APPARATUS, AND ELECTRONIC APPARATUS

BACKGROUND

1. Technical Field

The present invention relates to a mounting structure, an electro-optical apparatus, and an electronic apparatus.

2. Related Art

In some electro-optical apparatuses such as an organic electroluminescence apparatus (hereinafter, organic EL apparatus) thus far developed, an element substrate on which organic EL elements and circuits that drive the organic EL elements are mounted is connected to an external drive circuit via a flexible printed circuit (hereinafter, FPC). In this structure, the element substrate and the FPC each include a terminal block through which electrical signals are inputted and outputted, and an alignment mark for positional adjustment between the terminal blocks. For example, the alignment mark disclosed in JP-A-2006-235503 is provided on each of end portions of the terminal block. As another example, JP-A-2007-86276 proposes forming a slit-shaped opening on the terminal of the element substrate for use as the alignment mark, and adjusting the position of the FPC utilizing the terminal of the FPC, located inside the opening at the position corresponding to the opening, as the alignment mark.

However, to form the alignment mark as disclosed in JP-A-2006-235503, the element substrate and the FPC including the alignment mark have to have sufficient dimensions, which is disadvantageous from the viewpoint of reduction in size of the element substrate and the FPC. With the alignment mark according to JP-A-2007-86276, the opening has to be made narrower owing to thinning of the terminal on the side of the element substrate, typically a TFT array substrate, as a result of reduction in size of the electro-optical apparatus. Therefore, it becomes difficult to properly position the element substrate with respect to the terminal of the FPC serving as the alignment mark.

SUMMARY

An advantage of some aspects of the present invention is that a mounting structure is provided that minimizes at least a part of the foregoing drawbacks, as defined in the following application examples.

First Application Example

A first application example represents a mounting structure in which a plurality of substrates are electrically connected to each other. The mounting structure includes a first substrate having a first alignment mark formed by partially cutting away a first terminal and a second substrate having a second alignment mark formed by partially cutting away a second terminal. The first terminal and the second terminal are electrically connected to each other by being relatively positioned with respect to each other using the first alignment mark and the second alignment mark.

In the mounting structure configured as above, the first alignment mark and the second alignment mark are each formed by partially cutting away the first terminal or the second terminal. Accordingly, it is not necessary to form an alignment mark separately from the terminal, and therefore a gap between end portions of the terminal block and an end portion of the substrate can be made narrower, which enables reduction in size of the substrate. In addition, since the alignment marks are formed by partially cutting away the respective terminals, the shape of the alignment mark is not restricted by the width of the terminal, which allows the terminals provided on the respective substrates to be accurately positioned with respect to each other.

In the mounting structure according to the first application example, the first substrate and the second substrate may each include two or more terminals aligned in a first direction, and the alignment mark may be provided in each of the terminals at the respective ends of the two or more terminals aligned in the first direction. At least one of the terminals at the respective ends on the first substrate may serve as the first terminal, and at least one of the terminals at the respective ends on the second substrate may serve as the second terminal.

With the mentioned configuration, since the terminal having the alignment mark is located at the end of the terminal block, positional displacement between the terminals originating from rotation the substrate can be prevented, and therefore the terminals provided on the respective substrates can be positioned with respect to each other with higher accuracy.

In the mounting structure according to the first application example, the first substrate may include a third terminal located adjacent to the first terminal, the first alignment mark is formed near the third terminal of the first terminal, and the second alignment mark may be formed at a position corresponding to the first alignment mark.

The mentioned configuration allows the third terminal to serve as a part of the alignment mark.

In the mounting structure according to the first application example, the first alignment mark is formed in a region in which two or more terminals are formed, and the second alignment mark may be formed at a position corresponding to the first alignment mark.

With the mentioned configuration, since the alignment mark is formed in a region in which two or more terminals are formed, the alignment mark can be made longer in the direction in which the terminals are aligned, and therefore the positioning between the terminals in a direction intersecting the alignment direction of the terminals can be more accurately achieved.

In the mounting structure according to the first application example, the first substrate may include a third terminal located adjacent to the first terminal, the first alignment mark is formed so as to span over a first region, in which the first terminal is formed, and a second region, in which the third terminal is formed, and the second alignment mark may be formed at a position corresponding to the first alignment mark.

With the mentioned configuration, since the alignment mark is formed so as to span over the regions respectively occupied with the terminals adjacent to each other, the alignment mark can be made longer in the direction in which the terminals are aligned, and therefore the positioning between the terminals in the direction intersecting the alignment direction of the terminals can be more accurately achieved.

In the mounting structure according to the first application example, the first substrate may include a third terminal located adjacent to the first terminal and a fifth terminal located adjacent to the third terminal, and the second substrate may include a fourth terminal located adjacent to the second terminal and a sixth terminal located adjacent to the fourth terminal. The first alignment mark is formed so as to span over a first region, in which the first terminal is formed, and a third region, in which the fifth terminal is formed, and the second alignment mark is formed so as to span over a third region, in which the second terminal is formed, and a fourth region, in which the sixth terminal is formed.

With the mentioned configuration, since the alignment marks are formed so as to span over the regions respectively occupied with three terminals adjacent to each other, the alignment marks can be made longer in the direction in which the terminals are aligned, and therefore the positioning between the terminals in the direction intersecting the alignment direction of the terminals can be more accurately achieved.

In the mounting structure according to the first application example, the first alignment mark and the second alignment mark may each include a positioning portion with respect to a first direction.

With the mentioned configuration, since the first alignment mark and the second alignment mark each include the positioning portion with respect to the first direction, the positioning between the terminals in the first direction can be accurately achieved.

In the mounting structure according to the first application example, the first alignment mark and the second alignment mark may each include a positioning portion with respect to the first direction and a positioning portion with respect to a second direction intersecting the first direction.

With the mentioned configuration, since the first alignment mark and the second alignment mark each include the positioning portion with respect to the first direction and the positioning portion with respect to the second direction intersecting the first direction, the positioning between the terminals in the first direction and the second direction can be achieved at the same time. Therefore, positional displacement between the terminals originating from rotation of the first substrate or the second substrate can be prevented, and therefore the positioning between the terminals can be more accurately achieved.

In the mounting structure according to the first application example, the first alignment mark may be formed by partially cutting away the first terminal, and the second alignment mark may be a part of a conductive layer constituting the second terminal, and formed by cutting away a peripheral region of the part of the conductive layer.

With the mentioned configuration, the positioning can be performed by superposing the part of the conductive layer serving as the alignment mark, formed by cutting away the peripheral region of the part of the conductive layer, on the alignment mark formed by partially cutting away the terminal. Therefore, the positioning can be achieved with higher accuracy.

In the mounting structure according to the first application example, the alignment mark may be formed in one of two or more terminals wider than the other terminals.

With the mentioned configuration, since the alignment mark is provided in the wider terminal the alignment mark can be formed in a larger size, which enables the terminals to be positioned with respect to each other with higher accuracy.

In the mounting structure according to the first application example, the wider terminal may be assigned to a power source.

The mentioned configuration allows the alignment mark to be formed in a larger size utilizing the wider terminal assigned to the power source.

In the mounting structure according to the first application example, at least one of the first substrate and the second substrate may be light-transmissive.

With the mentioned configuration, both the first alignment mark and the second alignment mark can be visually observed at the same time by viewing from the side of the light-transmissive substrate. Therefore, the positioning between the terminals can be more accurately achieved.

Second Application Example

A second application example represents an electro-optical apparatus including a first substrate having an electro-optical element mounted thereon and a second substrate electrically connected to the first substrate. The first substrate includes a first terminal and a first alignment mark formed by partially cutting away the first terminal, and the second substrate includes a second terminal and a second alignment mark formed by partially cutting away the second terminal. The first terminal and the second terminal are electrically connected to each other by being relatively positioned with respect to each other using the first alignment mark and the second alignment mark.

In the electro-optical apparatus configured as above, the alignment marks are each formed in a region occupied with the terminal, and therefore a gap between end portions of the terminal block and an end portion of the substrate can be made narrower, which enables reduction in size of the substrate. In addition, since the alignment marks are formed by partially cutting away the respective terminals, the alignment marks are prevented from overlapping so as to disturb the positioning, and the terminals provided on the respective substrates can be accurately positioned with respect to each other.

In the electro-optical apparatus according to the second application example, the first substrate and the second substrate may each include two or more terminals aligned in a first direction, and the alignment mark may be provided in each of the terminals at the respective ends of the two or more terminals aligned in the first direction. At least one of the terminals at the respective ends on the first substrate may serve as the first terminal, and at least one of the terminals at the respective ends on the second substrate may serve as the second terminal.

With the mentioned configuration, since the terminals having the alignment mark are located at the respective ends of the terminal block, positional displacement between the terminals originating from rotation the first substrate or the second substrate can be prevented, and therefore the terminals provided on the respective substrates can be positioned with respect to each other with higher accuracy.

In the electro-optical apparatus according to the second application example, the first substrate may include a third terminal located adjacent to the first terminal, the first alignment mark may be formed near the third terminal of the first terminal, and the second alignment mark may be formed at a position corresponding to the first alignment mark.

The mentioned configuration allows the third terminal to serve as a part of the alignment mark.

In the electro-optical apparatus according to the second application example, the first alignment mark may be formed in a region in which two or more terminals are formed, and the second alignment mark may be formed at a position corresponding to the first alignment mark.

With the mentioned configuration, since the alignment mark is formed so as to span over the regions respectively occupied with the two or more terminals, the alignment mark can be made longer in the direction in which the terminals are aligned, and therefore the positioning between the terminals in a direction intersecting the alignment direction of the terminals can be more accurately achieved.

In the electro-optical apparatus according to the second application example, the first alignment mark and the second alignment mark may each include a positioning portion with respect to the first direction.

With the mentioned configuration, since the first alignment mark and the second alignment mark each include the positioning portion with respect to the first direction, the positioning between the terminals in the first direction can be accurately achieved.

In the electro-optical apparatus according to the second application example, the first alignment mark and the second alignment mark each include a positioning portion with respect to the first direction and a positioning portion with respect to a second direction intersecting the first direction.

With the mentioned configuration, since the first alignment mark and the second alignment mark each include the positioning portion with respect to the first direction and the positioning portion with respect to the second direction intersecting the first direction, the positioning between the terminals in the first direction and the second direction can be achieved at the same time. Therefore, positional displacement between the terminals originating from rotation of the first substrate or the second substrate can be prevented, and therefore the positioning between the terminals can be more accurately achieved.

In the electro-optical apparatus according to the second application example, the electro-optical element may be one of an organic electroluminescence element, a liquid crystal element, and an electrophoretic element.

The mentioned configuration provides an electro-optical apparatus including one of the organic electroluminescence element, the liquid crystal element, and the electrophoretic element, all of which provides highly reliable electrical connection in the wirings.

Third Application Example

A third application example represents an electronic apparatus incorporated with the electro-optical apparatus according to the second application example.

The electronic apparatus thus configured provides high reliability in electrical connection in the mounting structure, because of including the electro-optical apparatus defined as above.

BRIEF DESCRIPTION OF THE DRAWINGS

The invention will be described with reference to the accompanying drawings, wherein like numbers reference like elements.

FIG. 8A is a plan view of the element substrate and FIG. 8B is a plan view (see-through view) of the FPC, for explaining an alignment mark according to a second embodiment.

DESCRIPTION OF EXEMPLARY EMBODIMENTS

Figure 1:
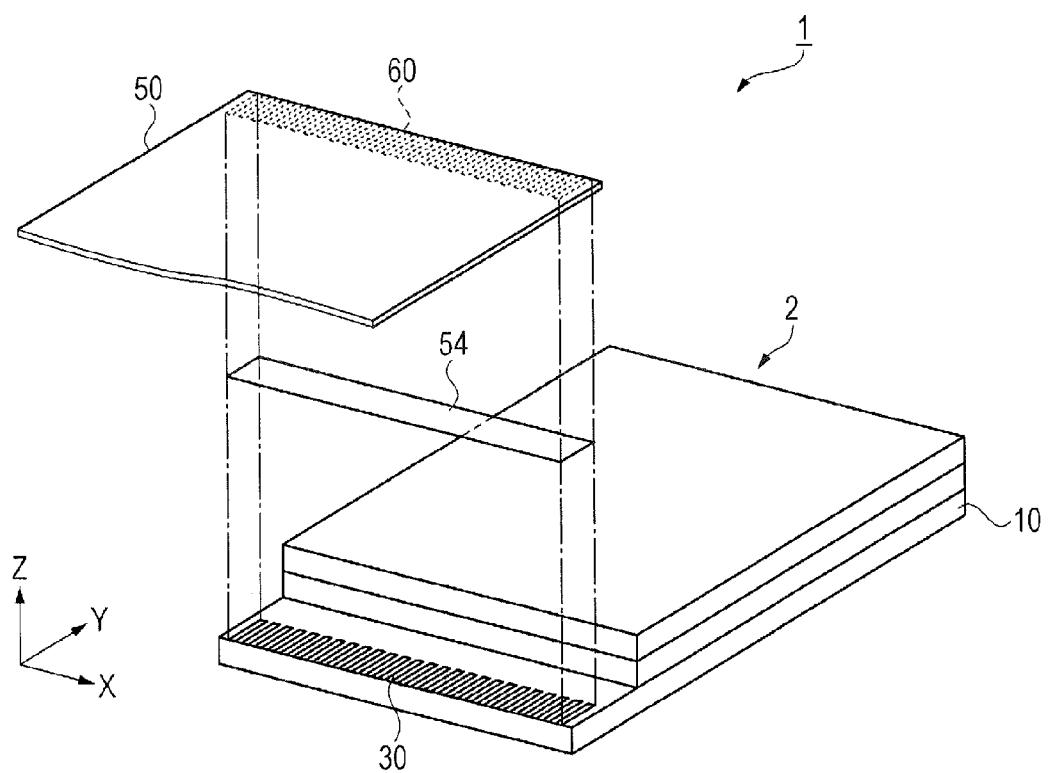
FIG. 1 is an exploded perspective view showing a configuration of an organic EL apparatus according to a first embodiment, exemplifying the electro-optical apparatus in the present invention.

Hereafter, embodiments of the present invention will be described with reference to the drawings. In the drawing, the scale of constituents may be different from the actual state for the sake of visual clarity.

In the description given below, the expression "on the substrate" will encompass a state where a constituent is located on the substrate in direct contact therewith, a state where the constituent is located on the substrate with another constituent interposed therebetween, and a state where a part of the constituent is located on the substrate in direct contact therewith and another part of the constituent is located on the substrate with another constituent interposed therebetween.

First Embodiment

Electro-Optical Apparatus

Referring first to FIG. 1, an organic EL apparatus according to a first embodiment, exemplifying an electro-optical apparatus to which the mounting structure in the present invention is applied, will be described.

FIG. 1 is an exploded perspective view showing a configuration of the organic EL apparatus according to a first embodiment, exemplifying the electro-optical apparatus in the present invention.

The organic EL apparatus 1 according to the first embodiment includes an organic EL panel 2 including an element substrate 10 having an organic EL element provided thereon and an FPC 50. The element substrate 10 corresponds to the first substrate, the organic EL element corresponds to the electro-optical element, and the FPC 50 corresponds to the second substrate in the present invention.

A plurality of terminals 30 are provided on the element substrate 10, and a plurality of terminal 60 are provided on the surface of the FPC 50 opposing the element substrate 10. The terminals 30 on the element substrate 10 are electrically connected to the respective terminals 60 on the FPC 50 via an anisotropic conductive film (hereinafter, ACF) 54. Here, the electrical connection between the terminals 30 and the terminals 60 in the organic EL apparatus 1 may be achieved via a solder paste, a silver paste, or a conductive adhesive, instead of the ACF 54.

In the organic EL apparatus 1 according to the first embodiment, the electrical connection between the terminals 30 on the element substrate 10 constituting the organic EL panel 2 and the respective terminals 60 on the FPC 50 is achieved by relatively positioning the element substrate 10 and the FPC 50 with respect to each other, by using non-illustrated alignment marks respectively formed in the terminal 30 and the terminal 60.

Organic EL Panel

The organic EL panel 2 of the organic EL apparatus 1 according to the first embodiment will be described, referring to FIGS. 2A to 3B.

Figure 2A:
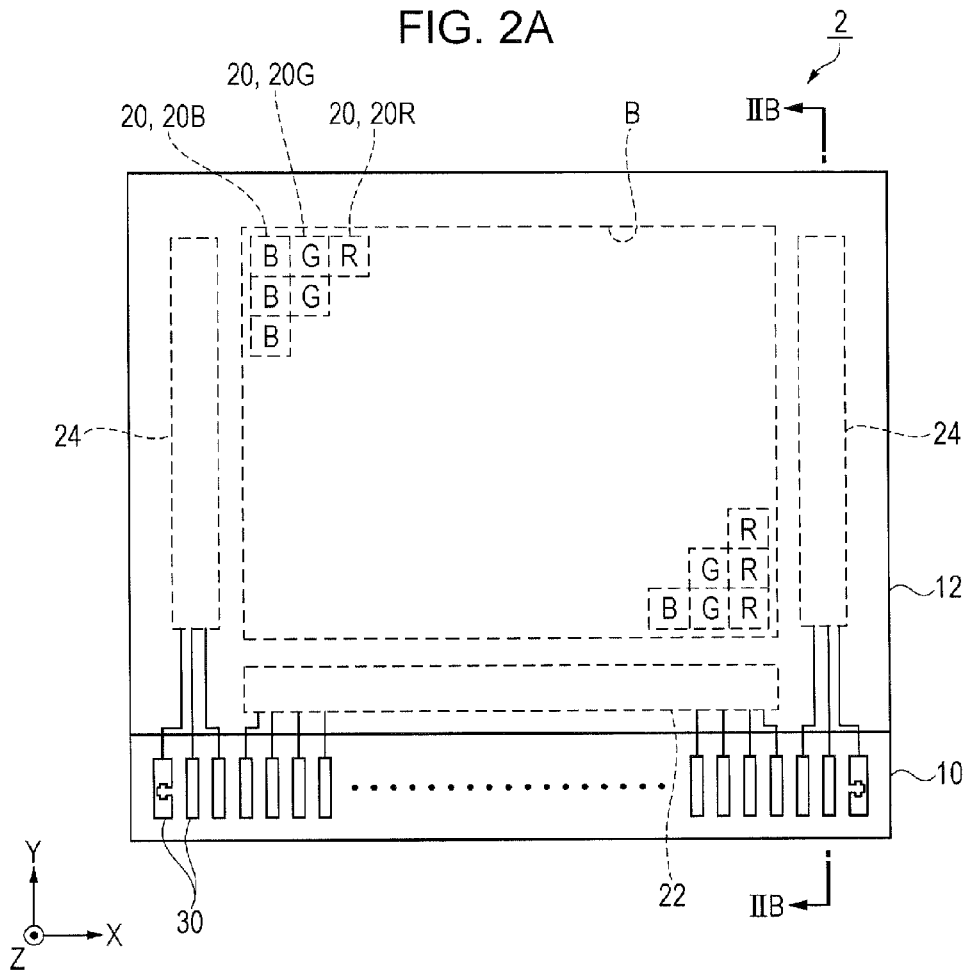
FIG. 2A is a schematic plan view showing a configuration of an organic EL panel.
Figure 2B:
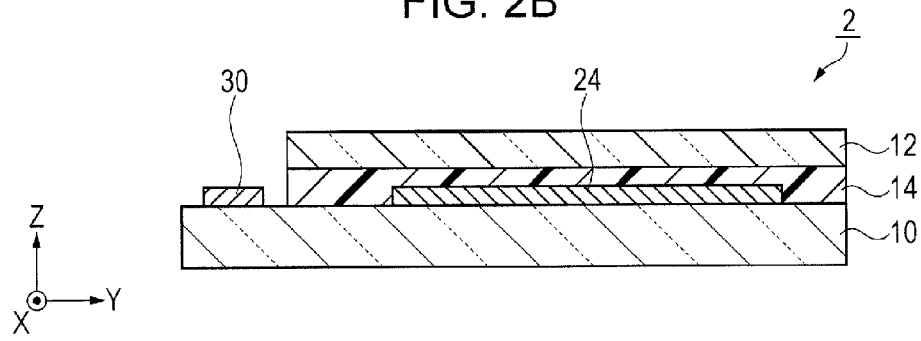
FIG. 2B is a cross-sectional view taken along a line IIB-IIB in FIG. 2A.

FIG. 2A is a schematic plan view showing a configuration of the organic EL panel 2, and FIG. 2B is a cross-sectional view taken along a line IIB-IIB in FIG. 2A.

As shown in FIGS. 2A and 2B, the organic EL panel 2 according to the first embodiment includes the element substrate 10 on which light emitting pixels 20, a data line drive circuit 22, a scanning line drive circuit 24, and the plurality of terminals 30 for electrical connection to an external circuit are provided, a seal substrate 12 protecting the light emitting pixels 20 and so forth, and a resin layer 14 bonding the element substrate 10 and the seal substrate 12 together.

The light emitting pixels 20 are arranged in a matrix array in a display region B on the element substrate 10. The light emitting pixels 20 include light emitting pixel 20B that emit blue light (B), light emitting pixels 20G that emit green light (G), and light emitting pixels 20R that emit red light (R). The light emitting pixels 20 that emit the same color are aligned in the vertical direction in the drawing, and the light emitting pixels 20 that emit different colors are aligned in the horizontal direction in the drawing, in repeated sequences of B, G, R. Such arrangement of the light emitting pixels 20 is known as a stripe pattern, and a different pattern may be adopted. For example, the order of the light emitting pixels 20 of different colors in the horizontal direction may be R, G, B, instead of B, G, R.

The light emitting pixels 20B, 20G, 20R each include an organic EL element and a color filter corresponding to one of B, G, R colors, to convert the light emitted from the organic EL element into B, G, R colors to realize full-color display. Here, an optical resonance structure that improves the luminance of a specific wavelength in the emission wavelength range of the organic EL element may be provided to each of the light emitting pixels 20B, 20G, 20R.

In the organic EL panel 2, the light emitting pixels 20B, 20G, 20R serve as sub pixels, and one each of the light emitting pixels 20B, 20G, 20R that respectively emit B, G, R colors constitute a pixel unit in the image display. However, the composition of the pixel unit is not limited to the above, and a light emitting pixel 20 that emit a color other than B, G, R (including white) may be included in the pixel unit. Hereinafter, the direction in which the light emitting pixels 20 of different colors are aligned on the element substrate 10 will be referred to as X-axis direction, and the direction in which the light emitting pixels 20 of the same color are aligned will be referred to as Y-axis direction.

The plurality of terminals 30 are aligned in the X-axis direction along a first edge of the element substrate 10. The data line drive circuit 22 and the scanning line drive circuit 24, which are peripheral circuits that drive and control the terminals 30 and the light emitting pixels 20, are electrically connected via a wiring.

The data line drive circuit 22 is disposed between the terminals 30 and the display region B in the Y-axis direction, and extends in the X-axis direction. A pair of the scanning line drive circuits 24 are opposed to each other in the X-axis direction across the display region B, and extend in the Y-axis direction between the display region B and respective second sides orthogonal to the first edge.

As shown in FIG. 2B, the element substrate 10 having the terminals 30 thereon and the seal substrate 12 which is light-transmissive are bonded together via the resin layer 14 which is both adhesive and light-transmissive. The light emitted from the light emitting pixels 20 is outputted from the side of the seal substrate 12 through a non-illustrated corresponding filter layer. Accordingly, the organic EL panel 2 is of a top emission type.

Since the organic EL panel 2 is of the top emission type, the element substrate 10 may be formed of either a light-transmissive material such as glass, or a non-transparent ceramic or a semiconductor.

In this embodiment, the element substrate 10 is a semiconductor substrate, for example a silicon substrate.

The terminals 30 and the alignment mark provided on the element substrate 10 will now be described in details, with reference to FIGS. 3A and 3B.

Figure 3A:
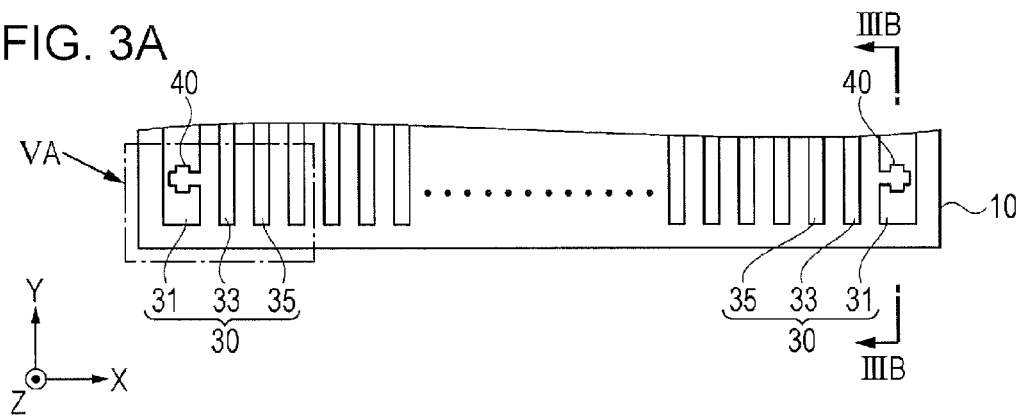
FIG. 3A is an enlarged schematic plan view of terminals provided on an element substrate.
Figure 3B:
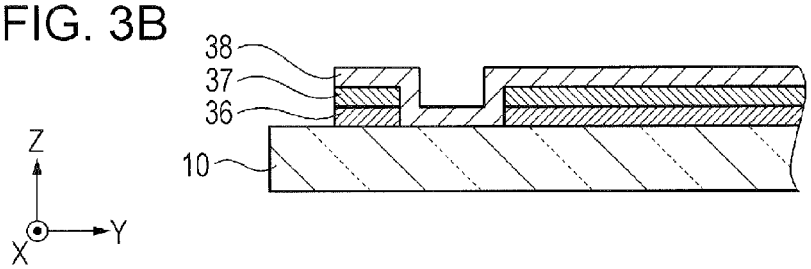
FIG. 3B is a cross-sectional view taken along a line IIIB-IIIB in FIG. 3A.

FIG. 3A is an enlarged schematic plan view of the terminals provided on the element substrate, and FIG. 3B is a cross-sectional view taken along a line IIIB-IIIB in FIG. 3A.

The plurality of terminals 30 each have an elongate and generally rectangular shape with the longitudinal side oriented in a direction orthogonal to the first edge of the element substrate 10, corresponding to the first substrate in the present invention, i.e., in the Y-axis direction, and are aligned along the first edge of the element substrate 10, i.e., in the X-axis direction. A first alignment mark 40 is formed in a region, in which a first terminal 31 is formed, located at both ends or one of the ends of the terminal block composed of the aligned terminals 30. The terminals 30 have different shapes in a plan view, and are classified into the first terminal 31 having the first alignment mark 40 and other ordinary terminals 30 (33, 35). The first terminal 31 having the first alignment mark 40 is wider in the X-axis direction than the other terminals 30 (33, 35). Further, the terminals 30 are formed by stacking a single or a plurality of conductive layers on the element substrate 10 in a predetermined shape. Here, assigning the first terminal 31 which is wider to a power source leads to reduction in heat generation due to ohmic loss (resistance loss due to surface resistance) originating from thinning of the terminals, thereby significantly contributing to suppressing an increase in power consumption.

In this embodiment, the terminals 30 are composed of three layers as shown in FIG. 3B, which are an aluminum (Al) layer 36, a titanium nitride (TiN) layer 37, and an indium tin oxide (ITO) layer 38 which is a transparent conductive layer, from the bottom. The first alignment mark 40 is only formed of the ITO layer 38, without the aluminum layer 36 and the titanium nitride layer 37. In general, bringing ITO and aluminum into contact provokes electrical corrosion, which leads to imperfect electrical connection due to disconnection of the aluminum. In this embodiment, however, the titanium nitride layer 37 is provided between the ITO layer 38 and the aluminum layer 36 for electrical connection therebetween via the titanium nitride layer 37, and therefore the mentioned malfunction can be prevented.

Without limitation to the above, the terminals 30 may be formed of a single metal such as titanium (Ti), chrome (Cr), tungsten (W), tantalum (Ta), or molybdenum (Mo), an alloy thereof, a conductive layer formed of a metal silicide, polysilicide, or polysilicon, or a multilayer including the cited materials.

Further, the layers constituting the terminals 30 in this embodiment are formed from the same materials and at the same time as the conductive layers constituting other circuits such as a non-illustrated scanning line and data line, on the element substrate 10. Such an arrangement allows the terminals 30 to be formed without incurring an increase in number of manufacturing steps.

Although the foregoing description of the first embodiment refers to the organic EL apparatus 1 including the top emission type organic EL panel 2 as an example of the electro-optical apparatus in the present invention, the organic EL apparatus 1 may be of a bottom emission type which emits light from the side of the element substrate 10. Further, the electro-optical apparatus may be a liquid crystal device including liquid crystal elements or an electrophoretic display (EPD) including electrophoretic elements, instead of the organic EL apparatus 1.

FPC

Figure 4:
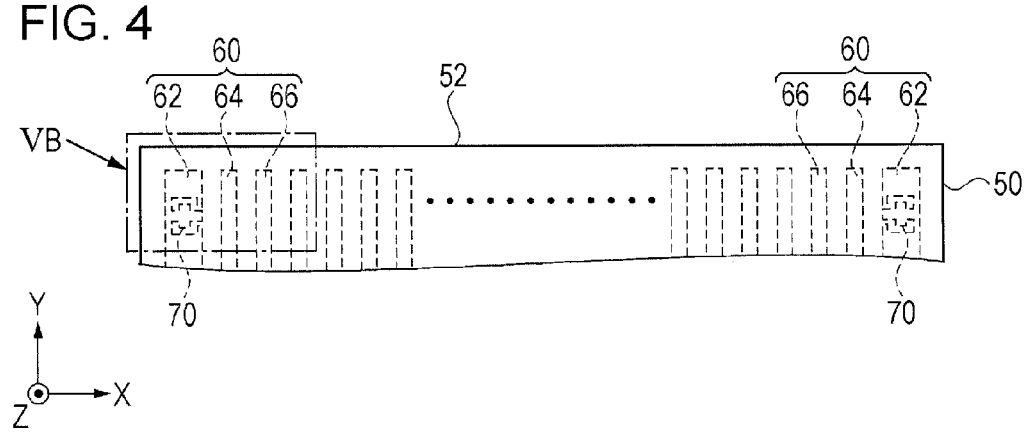
FIG. 4 is an enlarged schematic plan view of terminals provided on an FPC.

Referring now to FIG. 4, the FPC 50 connected to the element substrate 10 of the organic EL panel 2 according to the first embodiment will be described hereunder. FIG. 4 is an enlarged schematic plan view of the terminals provided on the FPC.

The FPC 50 corresponding to the second substrate in the present invention is a flexible circuit substrate, composed of a film of an electrically insulative material such as polyimide, and wirings formed of a copper foil which is a conductor. In this embodiment, the film of an electrically insulative material such as polyimide employed in the FPC 50 is light-transmissive. However, the FPC 50 may be non-light-transmissive.

The plurality of terminals 60 are provided on the surface of the FPC 50 opposed to the element substrate 10, in a region for connection to the element substrate 10 of the organic EL panel 2, and aligned at predetermined intervals along an edge 52. In addition, though not illustrated in FIG. 4, a terminal for electrical connection to an external circuit that controls the drive circuit on the element substrate 10 of the organic EL panel 2 is provided on a connection end opposite to the edge 52 along which the terminals 60 are aligned.

As shown in FIG. 4, the terminals 60 on the FPC 50 are aligned in the X-axis direction at the same intervals as the terminals 30 on the element substrate 10, and each have an elongate and generally rectangular shape with the longitudinal side oriented in a direction orthogonal to the edge 52, i.e., in the Y-axis direction. A second alignment mark 70 is formed in a region, in which a second terminal 62 is formed, located at both ends or one of the ends of the terminal block composed of the aligned terminals 60. The terminals 60 have different shapes in a plan view, and are classified into the second terminal 62 having the second alignment mark 70 and other ordinary terminals 60 (64, 66). The second terminal 62 having the second alignment mark 70 is wider in the X-axis direction than the other terminals 60 (64, 66). Further, each of the terminals 60 is narrower in the X-axis direction than the corresponding one of the terminals 30 on the element substrate 10.

The terminals 60 are formed of a conductive layer, for example a pattern formed of copper foil and plated with nickel or gold. In this embodiment, the FPC 50 is formed of a light-transmissive film, and therefore the region other than the terminals 60, formed of the copper foil and plating and hence constituting a light-shielding region, constitutes a light-transmissive region. Accordingly, when the FPC 50 is superposed on the element substrate 10 and viewed from above, the first alignment mark 40 formed on the element substrate 10 can be seen through. Therefore, the first alignment mark 40 on the element substrate 10 and the second alignment mark 70 on the FPC 50 can be seen at the same time, which enables the first alignment mark 40 on the element substrate 10 and the second alignment mark 70 on the FPC 50 to be accurately positioned with respect to each other.

Hereunder, the first alignment mark 40 and the second alignment mark 70 according to the first embodiment, respectively provided on the element substrate 10 and the FPC 50, will be described in details with reference to FIGS. 5A to 7.

Figure 5A:
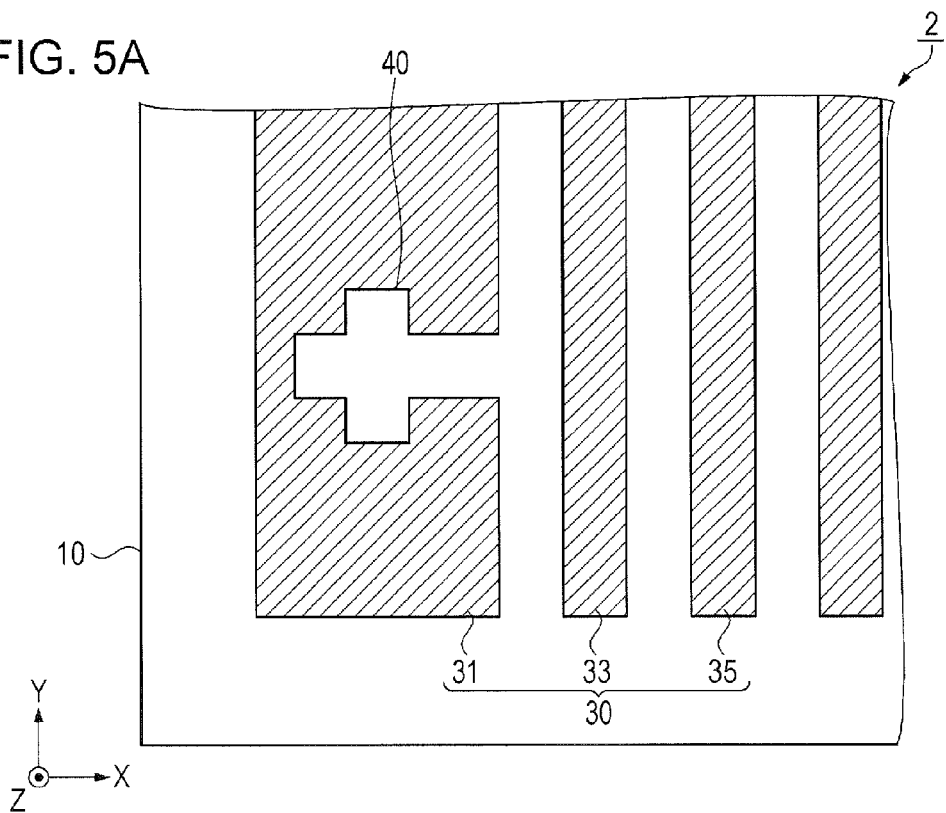
FIG. 5A is an enlarged schematic plan view corresponding to a portion marked as VA in FIG. 3A
Figure 5B:
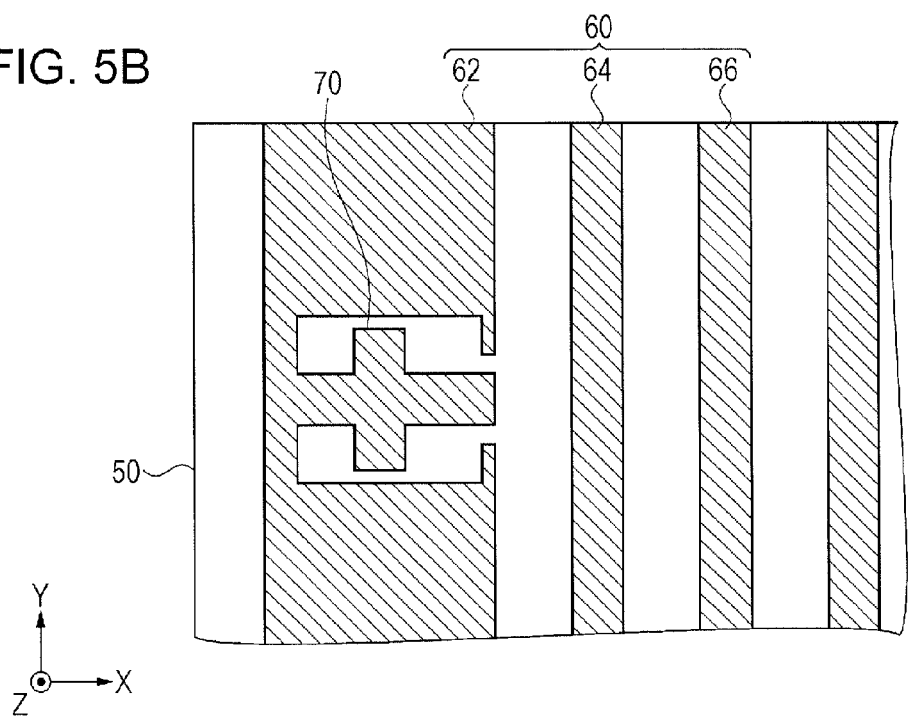
FIG. 5B is an enlarged schematic plan view (see-through view) corresponding to a portion marked as VB in FIG. 4, for explaining an alignment mark according to the first embodiment.

FIG. 5A is an enlarged schematic plan view corresponding to a portion marked as VA in FIG. 3A, and FIG. 5B is an enlarged schematic plan view (see-through view) corresponding to a portion marked as VB in FIG. 4, for explaining the alignment marks according to the first embodiment. FIG. 5B illustrates the terminals 60 and the second alignment mark 70 on the FPC 50 seen through from the side of the FPC 50, for facilitating the understanding of the positional relationship with respect to the terminals 30 and the first alignment mark 40 on the element substrate 10 shown in FIG. 5A.

As shown in FIG. 5A, among the plurality of terminals 30 provided on the element substrate 10 corresponding to the first substrate in the present invention, the first alignment mark 40 is formed in the first terminal 31, located at both ends or one of the ends of the terminal block composed of the aligned terminals 30 and wider in the X-axis direction than other terminals 30 (33, 35). The first alignment mark 40 includes, in the region occupied with the first terminal 31, a cutaway portion serving as a positioning portion with respect to the Y-axis direction, which is the first direction, i.e., extending in the X-axis direction, and another cutaway portion serving as the positioning portion with respect to the X-axis direction, which is the second direction intersecting the first direction, i.e., extending in the Y-axis direction.

As shown in FIG. 5B, on the FPC 50 corresponding to the second substrate in the present invention, the second alignment mark 70 is formed in the second terminal 62, located at both ends or one of the ends of the terminal block composed of the aligned terminals 60 and wider in the X-axis direction than other terminals 60 (64, 66), as among the terminals 30 on the element substrate 10. In addition, the second alignment mark 70 is located in the second terminal 62 on the FPC 50, at the position relatively corresponding to the first alignment mark 40 formed in the first terminal 31 on the element substrate 10 when the FPC 50 is superposed on the element substrate 10. The second alignment mark 70 includes a cutaway portion formed in a region occupied with the second terminal 62, so as to form a conductive layer pattern that serves as a positioning portion with respect to the Y-axis direction, which is the first direction, and another positioning portion with respect to the X-axis direction.

Figure 6:
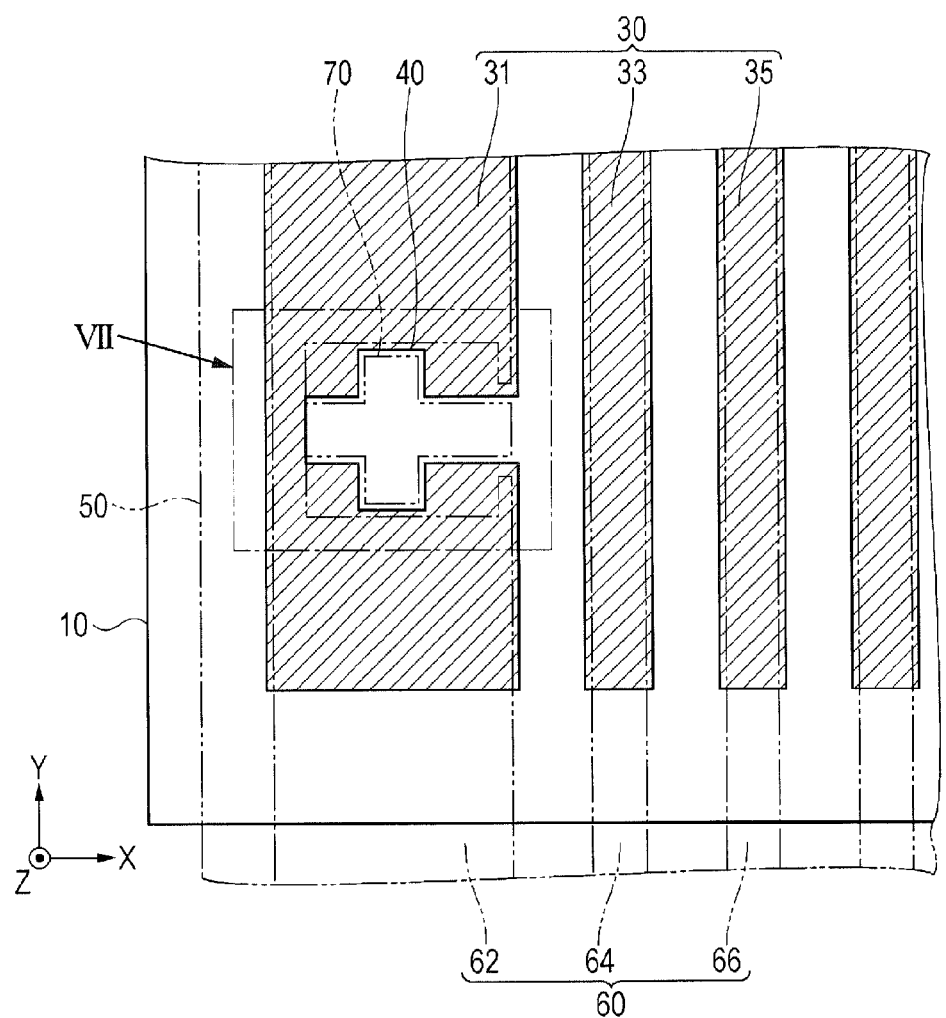
FIG. 6 is a schematic plan view showing the alignment marks of the element substrate and the FPC positioned with respect to each other.
Figure 7:
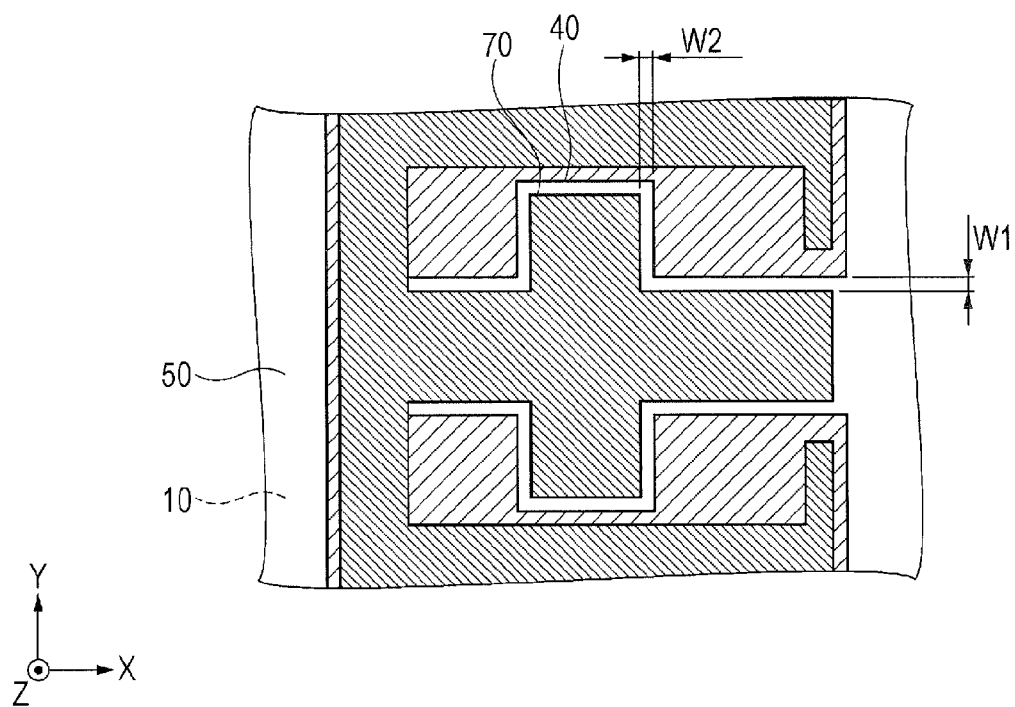
FIG. 7 is an enlarged plan view of a portion marked as VII in FIG. 6.

Referring now to FIGS. 6 and 7, the state realized by superposing the FPC 50 on the element substrate 10 for positioning between the first alignment mark 40 and the second alignment mark 70 will be described hereunder.

FIG. 6 is a schematic plan view showing the alignment marks of the element substrate and the FPC positioned with respect to each other. FIG. 7 is an enlarged plan view of a portion marked as VII in FIG. 6. In FIG. 6, the FPC 50 including the terminals 60 and the second alignment mark 70 is indicated by dash-dot-dot lines.

As shown in FIGS. 6 and 7, the plurality of terminals 30 on the element substrate 10 and the plurality of terminals 60 on the FPC 50 can be respectively positioned with each other accurately for electrical connection, by placing the conductive layer pattern serving as the second alignment mark 70 formed by partially cutting away the region occupied with the second terminal 62, so as to fit inside the first alignment mark 40 formed by partially cutting away the region occupied with the first terminal 31. Here, it is preferable that, upon achieving the positioning, a gap W1 in the Y-axis direction and a gap W2 in the X-axis direction between the first alignment mark 40 and the conductive layer pattern serving as the second alignment mark 70 are 5 µm to 20 µm, and more preferably approximately 10 µm, though the value may vary depending on the magnification of the microscope employed for the positioning.

The terminals 60 on the FPC 50 are narrower in the X-axis direction than the corresponding ones of the terminals 30 on the element substrate 10. Accordingly, the terminals 30 can be seen through in a plan view from the side of the FPC 50 with the FPC 50 superposed on the element substrate 10, and therefore the positioning in the X-axis direction can be accurately achieved by making the gap between the terminal 60 and the corresponding terminal 30 on both sides in the X-axis direction equal to each other.

Second Embodiment

Referring to FIGS. 8A to 10, configurations of a first alignment mark and a second alignment mark according to a second embodiment will be described hereunder.

FIG. 8A is a plan view of an element substrate 10a and FIG. 8B is a plan view (see-through view) of an FPC 50a, for explaining the alignment marks according to the second embodiment. FIG. 8B illustrates terminals 60a and the second alignment mark 70a on the FPC 50a seen through from the side of the FPC 50a, for facilitating the understanding of the positional relationship with respect to terminals 30a and the first alignment mark 40a on the element substrate 10z shown in FIG. 8A.

The first alignment mark 40a and the second alignment mark 70a according to the second embodiment are different in shape from the first alignment mark 40 and the second alignment mark 70 according to the first embodiment. Therefore, the same constituents as those of the first embodiment are given the same numeral with "a", and the description thereof will not be repeated.

As shown in FIGS. 8A and 8B, the first alignment mark 40a is formed by partially cutting away the region occupied with the first terminal 31a, which is wider in the X-axis direction than other terminals 30a provided on the element substrate 10a of the organic EL panel 2a. The first alignment mark 40a is formed on the side of a third terminal 33a adjacent to the first terminal 31a. Further, the first alignment mark 40a has a generally rectangular shape with the longitudinal side oriented in the X-axis direction, formed by partially cutting away the first terminal 31a in the X-axis direction from the side of the third terminal 33a adjacent thereto. The mentioned configuration corresponds to the positioning portion with respect to the Y-axis direction which is the first direction.

The second alignment mark 70a is formed in the second terminal 62a which is wider in the X-axis direction than other terminals 60a provided on the FPC 50a, on the side of a fourth terminal 64a adjacent to the second terminal 62a and at the position relatively corresponding to the first alignment mark 40a formed in the first terminal 31a of the element substrate 10a when the FPC 50a is superposed on the element substrate 10a. Further, the second alignment mark 70a has a generally rectangular shape with the longitudinal side oriented in the x-axis direction, formed by partially cutting away the second terminal 62a in the X-axis direction from the side of the fourth terminal 64a adjacent thereto. A width W4 of the second alignment mark 70a in the Y-axis direction is wider than a width W3 of the first alignment mark 40a formed in the element substrate 10a.

Figure 9:
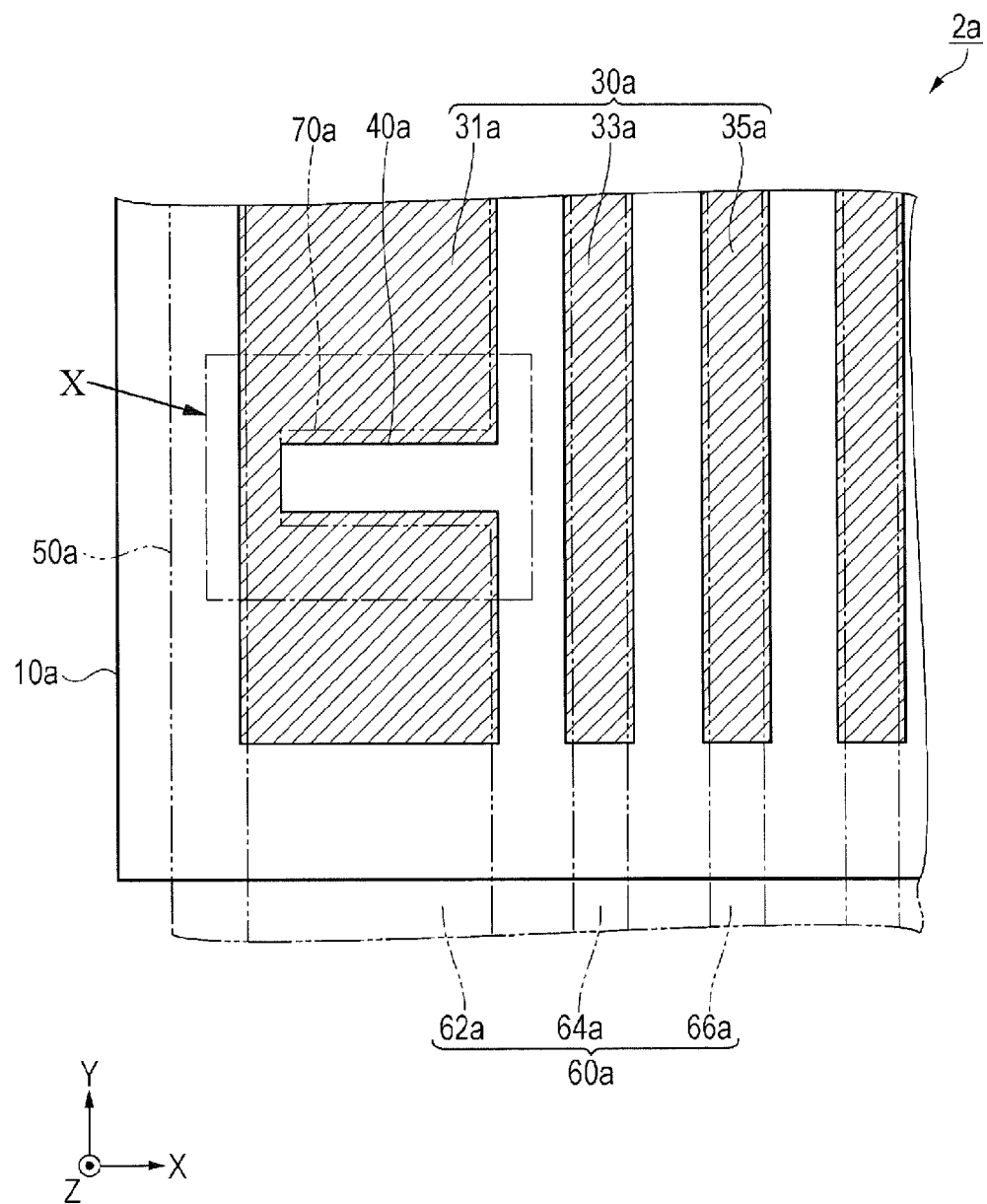
FIG. 9 is a schematic plan view showing the alignment marks of the element substrate and the FPC positioned with respect to each other.
Figure 10:
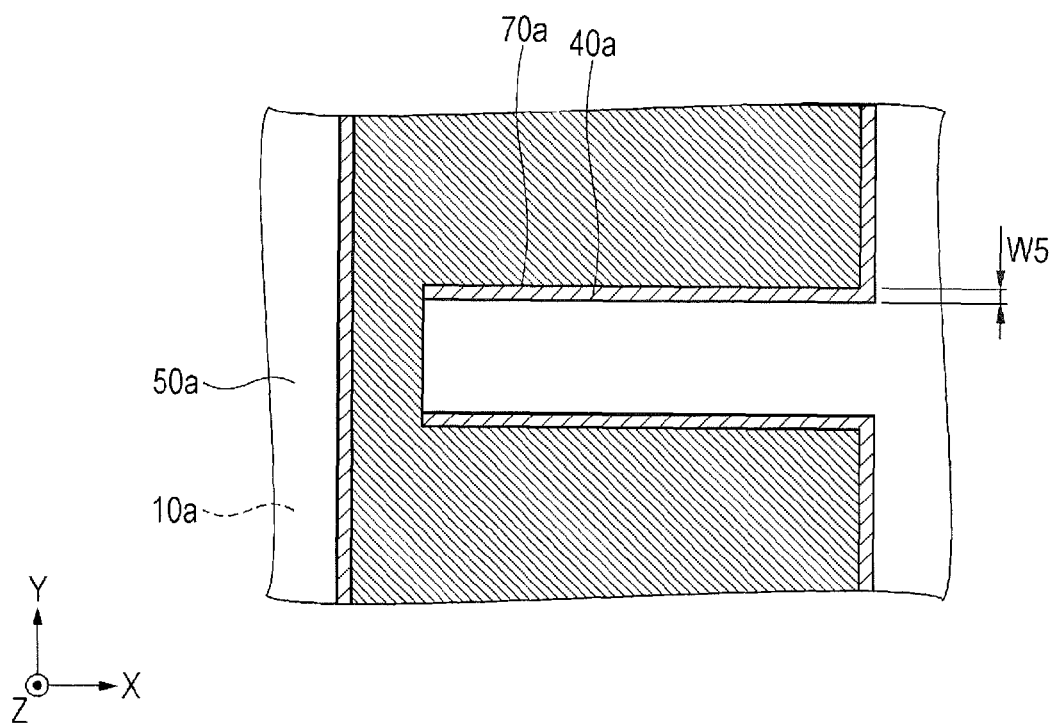
FIG. 10 is an enlarged plan view of a portion marked as X in FIG. 9.

Referring now to FIGS. 9 and 10, the state realized by superposing the FPC 50a on the element substrate 10a for positioning between the first alignment mark 40a and the second alignment mark 70a will be described hereunder.

FIG. 9 is a schematic plan view showing the alignment marks of the element substrate and the FPC positioned with respect to each other. FIG. 10 is an enlarged plan view of a portion marked as X in FIG. 9. In FIG. 9, the FPC 50a including the terminals 60a and the second alignment mark 70a is indicated by dash-dot-dot lines.

As shown in FIGS. 9 and 10, the plurality of terminals 30a on the element substrate 10a and the plurality of terminals 60a on the FPC 50a can be respectively positioned with each other accurately for electrical connection, by placing the first alignment mark 40a formed by partially cutting away the first terminal 31a so as to fit inside the second alignment mark 70a formed by partially cutting away the second terminal 62a. Here, it is preferable that, upon achieving the positioning, a gap W5 in the Y-axis direction between the first alignment mark 40a and the second alignment mark 70a is 5 µm to 20 µm, and more preferably approximately 10 µm, though the value may vary depending on the magnification of the microscope employed for the positioning.

Third Embodiment

Figure 11A:
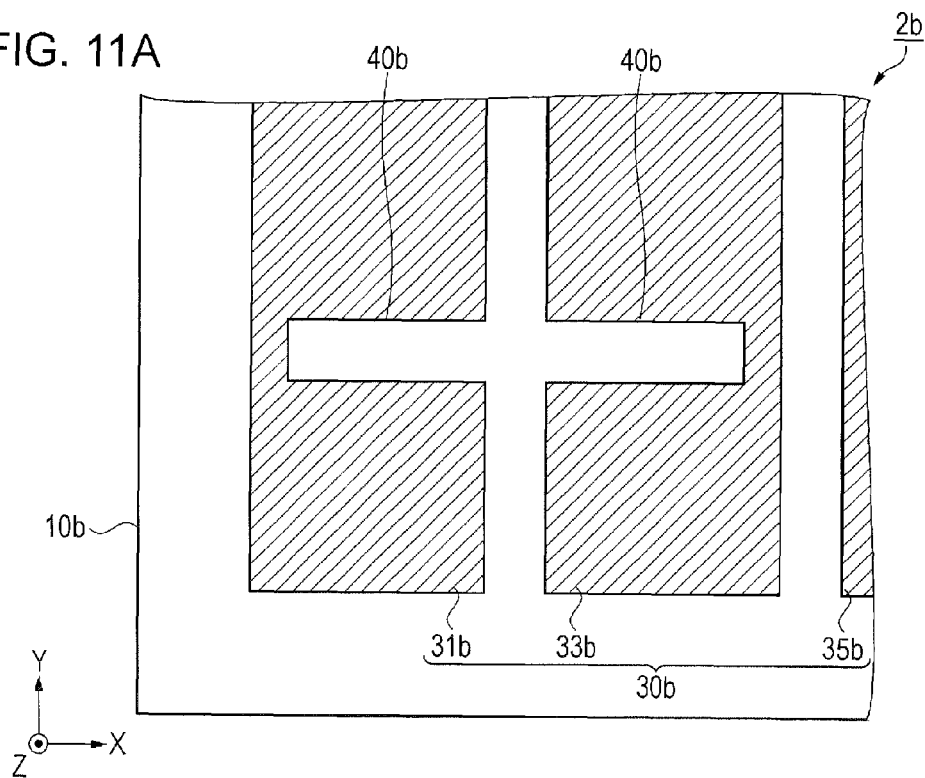
FIG. 11A is a plan view of the element substrate and FIG. 11B is a plan view (see-through view) of the FPC, for explaining an alignment mark according to a third embodiment.
Figure 11B:
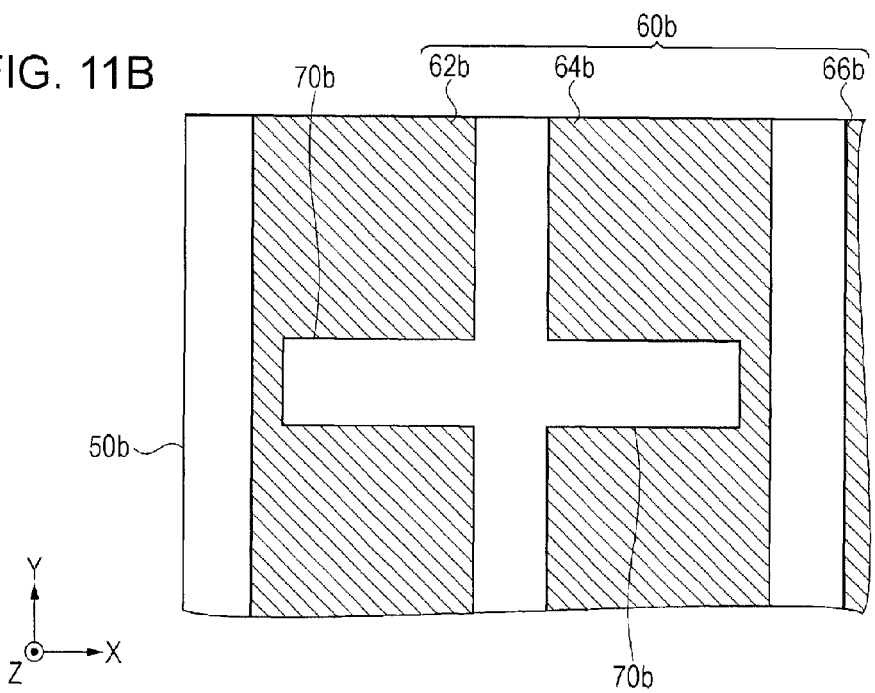

Referring to FIGS. 11A and 11B, configurations of a first alignment mark and a second alignment mark according to a third embodiment will be described hereunder.

FIG. 11A is a plan view of an element substrate 10b and FIG. 11B is a plan view (see-through view) of an FPC 50b, for explaining the alignment marks according to the third embodiment.

The first alignment mark 40b and the second alignment mark 70b according to the third embodiment are different in shape from the first alignment mark 40 and the second alignment mark 70 according to the first embodiment. Therefore, the same constituents as those of the first embodiment are given the same numeral with "b", and the description thereof will not be repeated.

As shown in FIGS. 11A and 11B, the first alignment mark 40b is formed so as to span over the first terminal 31b, which is wider in the X-axis direction than other terminals 30b provided on the element substrate 10b of the organic EL panel 2b, and a third terminal 33b adjacent to the first terminal 31b and having generally the same width as the first terminal 31b in the X-axis direction. The first alignment mark 40b includes a cutaway portion of a generally rectangular shape extending in the X-axis direction in the region occupied with the first terminal 31b from the side of the third terminal 33b adjacent thereto, and another cutaway portion of a generally rectangular shape extending in the X-axis direction in the region occupied with the third terminal 33b from the side of the first terminal 31b. Further, the cutaway portion formed in the first terminal 31b is opposed to the cutaway portion formed in the third terminal 33b. The mentioned configuration corresponds to the positioning portion with respect to the Y-axis direction which is the first direction.

The second alignment mark 70b is formed so as to span over the second terminal 62b, which is wider in the X-axis direction than other terminals 60b provided on the FPC 50b, and a fourth terminal 64b adjacent to the second terminal 62b and having generally the same width as the second terminal 62b in the X-axis direction. The second alignment mark 70b includes a cutaway portion of a generally rectangular shape extending in the X-axis direction in the region occupied with the second terminal 62b from the side of the fourth terminal 64b adjacent thereto, and another cutaway portion of a generally rectangular shape extending in the X-axis direction in the region occupied with the fourth terminal 64b from the side of the second terminal 62b. In addition, the second alignment mark 70b is located in the second terminal 62b on the FPC 50b, at the position relatively corresponding to the first alignment mark 40b formed so as to span over the first terminal 31b and the third terminal 33b on the element substrate 10b when the FPC 50b is superposed on the element substrate 10b. The width of the second alignment mark 70b in the Y-axis direction is wider than the width of the first alignment mark 40b formed in the element substrate 10b.

The first alignment mark 40b and the second alignment mark 70b are formed so as to span over the two terminals 30b (31b, 33b) adjacent to each other and the two terminals 60b (62b, 64b) adjacent to each other, respectively, the alignment marks can be made longer in the X-axis direction, and therefore the positioning in the Y-axis direction can be accurately achieved. Further, assigning the first terminal 31b, the second terminal 62b, the third terminal 33b, and the fourth terminal 64b, which are wider than the remaining terminals, to the power source leads to reduction in heat generation due to ohmic loss (resistance loss due to surface resistance) originating from thinning of the terminals, thereby significantly contributing to suppressing an increase in power consumption.

Fourth Embodiment

Figure 12A:
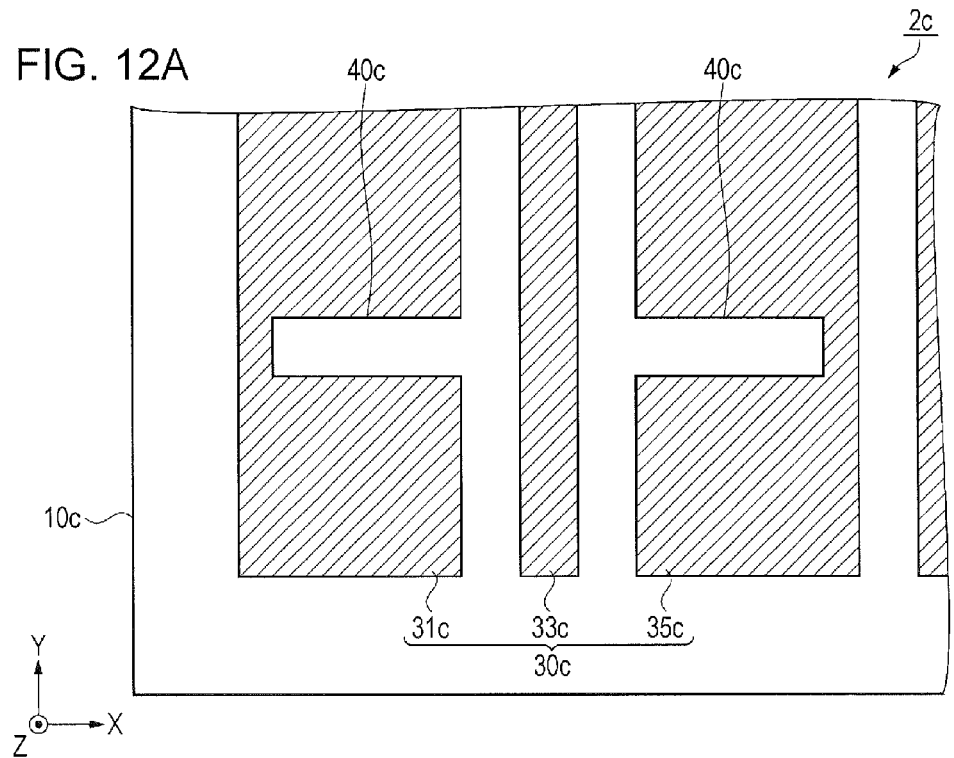
FIG. 12A is a plan view of the element substrate and FIG. 12B is a plan view (see-through view) of the FPC, for explaining an alignment mark according to a fourth embodiment.
Figure 12B:
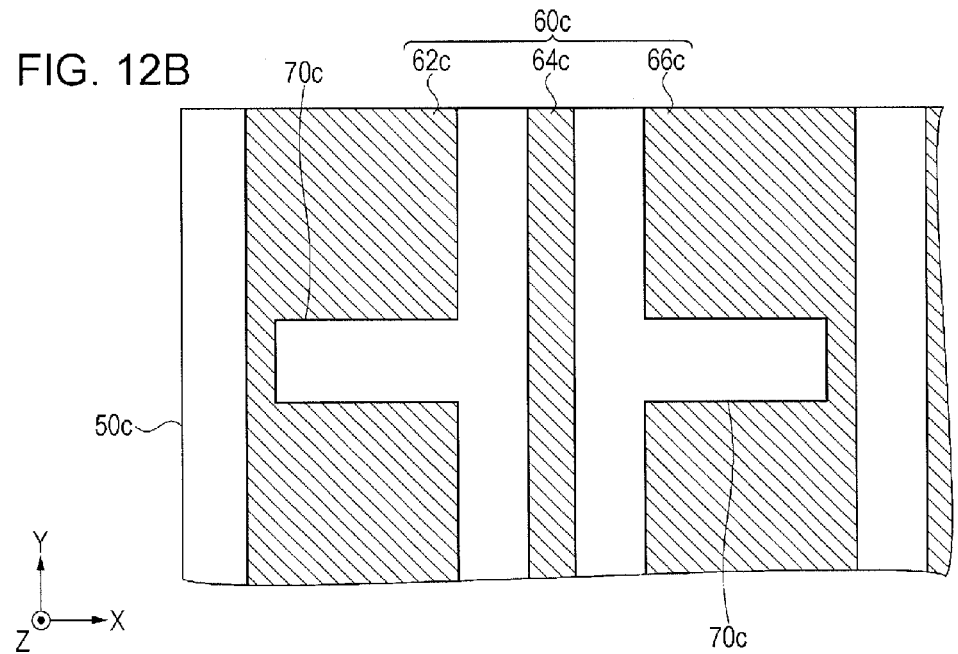

Referring to FIGS. 12A and 12B, configurations of a first alignment mark and a second alignment mark according to a fourth embodiment will be described hereunder.

FIG. 12A is a plan view of an element substrate 10c and FIG. 12B is a plan view (see-through view) of an FPC 50c, for explaining the alignment marks according to the fourth embodiment.

The first alignment mark 40c and the second alignment mark 70c according to the fourth embodiment are different in shape from the first alignment mark 40 and the second alignment mark 70 according to the first embodiment. Therefore, the same constituents as those of the first embodiment are given the same numeral with "c", and the description thereof will not be repeated.

As shown in FIGS. 12A and 12B, the first alignment mark 40c is formed so as to span over the first terminal 31c, which is wider in the X-axis direction than other terminals 30c provided on the element substrate 10c of the organic EL panel 2c, the third terminal 33c adjacent to the first terminal 31c, and a fifth terminal 35c adjacent to the third terminal 33c and having generally the same width as the first terminal 31c in the X-axis direction. The first alignment mark 40c includes a cutaway portion of a generally rectangular shape extending in the X-axis direction in the region occupied with the first terminal 31c from the side of the third terminal 33c adjacent thereto, and another cutaway portion of a generally rectangular shape extending in the X-axis direction in the region occupied with the fifth terminal 35c from the side of the third terminal 33c. Further, the cutaway portion formed in the first terminal 31c is opposed to the cutaway portion formed in the fifth terminal 35c across the third terminal 33c. The mentioned configuration corresponds to the positioning portion with respect to the Y-axis direction which is the first direction.

The second alignment mark 70c is formed so as to span over the second terminal 62c, which is wider in the X-axis direction than other terminals 60c provided on the FPC 50c, the fourth terminal 64c adjacent to the second terminal 62c, and a sixth terminal 66c adjacent to the fourth terminal 64c and having generally the same width as the second terminal 62c in the X-axis direction. The second alignment mark 70c includes a cutaway portion of a generally rectangular shape extending in the X-axis direction in the region occupied with the second terminal 62c from the side of the fourth terminal 64c adjacent thereto, and another cutaway portion of a generally rectangular shape extending in the X-axis direction in the region occupied with the sixth terminal 66c from the side of the fourth terminal 64c. In addition, the second alignment mark 70c is located in the second terminal 62c and the sixth terminal 66c on the FPC 50c, at the position relatively corresponding to the first alignment mark 40c formed so as to span over the first terminal 31c and the fifth terminal 35c on the element substrate 10c when the FPC 50c is superposed on the element substrate 10c. The width of the second alignment mark 70c in the Y-axis direction is wider than the width of the first alignment mark 40c formed in the element substrate 10c.

The first alignment mark 40c and the second alignment mark 70c are formed so as to span over the three terminals 30c (31c, 33c, 35c) adjacent to each other and the three terminals 60c (62c, 64c, 66c) adjacent to each other, respectively, the alignment marks can be made longer in the X-axis direction, and therefore the positioning in the Y-axis direction can be accurately achieved. Further, assigning the first terminal 31c, the second terminal 62c, the fifth terminal 35c, and the sixth terminal 66c, which are wider than the remaining terminals, to the power source leads to reduction in heat generation due to ohmic loss (resistance loss due to surface resistance) originating from thinning of the terminals, thereby significantly contributing to suppressing an increase in power consumption.

Electronic Apparatus

Figure 13:
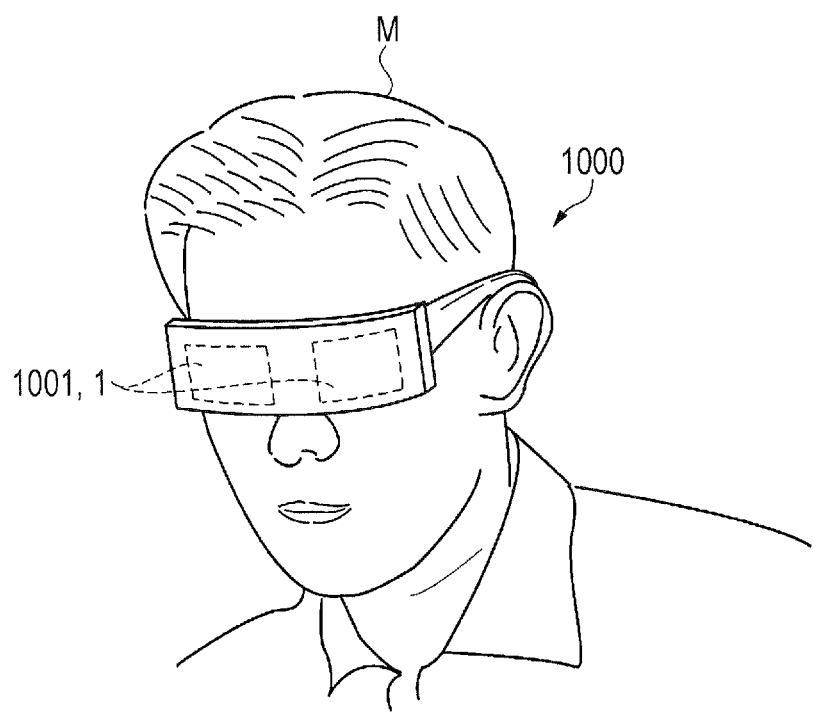
FIG. 13 is a schematic drawing showing a head-mounted display exemplifying the electronic apparatus in the present invention.

Referring now to FIG. 13, an electronic apparatus including the organic EL apparatus 1 according to the foregoing embodiments of the present invention will be described hereunder. FIG. 13 is a schematic drawing showing a head-mounted display exemplifying the electronic apparatus in the present invention.

As shown in FIG. 13, the head-mounted display (HMD) 1000 according to this embodiment, exemplifying the electronic apparatus, includes a pair of display regions 1001 respectively corresponding to the left and right eyes. The viewer M can watch characters and images displayed in the display regions 1001, upon wearing the head-mounted display 1000 on the head like glasses. In the case where images with a parallax are displayed in the left and right display regions 1001, the viewer can enjoy three-dimensional pictures.

The organic EL apparatus 1 according to the foregoing embodiments, which is a self-luminous display device, is mounted in the display regions 1001. Therefore, the head-mounted display 1000 can be made light in weight and provides high reliability in light emitting performance.

The head-mounted display 1000 may be configured for the viewer M to indirectly view images in the display regions 1001 using a mirror or the like, instead of directly viewing the images.

The head-mounted display 1000 may include only a single display region 1001 to be viewed with one of the left and right eyes, instead of a pair of display regions 1001.

The electronic apparatus incorporated with the organic EL apparatus 1 is not limited to the head-mounted display 1000. To cite a few examples, the present invention is applicable to electronic apparatuses that include a display region, such as a head-up display, an electronic view finder (EVF) of a digital camera, a mobile information terminal, and a car navigation system. Further, in addition to display devices, the present invention is also applicable to illumination devices and exposure devices.

Although the embodiments of the mounting structure, the electro-optical apparatus and the electronic apparatus according to the present invention have been described as above, it is to be understood that the present invention is in no way limited to those embodiments, and specific configurations of the constituents may be substituted with those having the same functions as desired. Further, a desired constituent may be added to the present invention, and one or more embodiments described above may be combined as desired.

The entire disclosure of Japanese Patent Application No. 2013-155348, filed Jul. 26, 2013 is expressly incorporated by reference herein.

What is claimed is:

1. A mounting structure in which a plurality of substrates are electrically connected to each other, the mounting structure comprising:
a first substrate having a first alignment mark formed by partially cutting away a first terminal; and
a second substrate having a second alignment mark formed by partially cutting away a second terminal,
wherein the first terminal and the second terminal are electrically connected to each other by being relatively positioned with respect to each other using the first alignment mark and the second alignment mark.

2. The mounting structure according to claim 1,
wherein the first substrate and the second substrate each include a group of terminals aligned in a first direction,
for each substrate, the alignment mark is provided in a terminal at one of two ends of the respective group of terminals,
at least one of the terminals at the ends on the first substrate serves as the first terminal, and
at least one of the terminals at the ends on the second substrate serves as the second terminal.

3. The mounting structure terminal according to claim 1,
wherein the first substrate includes a third terminal located adjacent to the first terminal,
the first alignment mark is formed in a portion of the first terminal near the third terminal, and
the second alignment mark is formed at a position corresponding to the first alignment mark.

4. The mounting structure according to claim 1,
wherein the first alignment mark is formed in a region in which two or more terminals are formed, and
the second alignment mark is formed at a position corresponding to the first alignment mark.

5. The mounting structure according to claim 1,
wherein the first substrate includes a third terminal located adjacent to the first terminal,
the first alignment mark is formed so as to span over a first region, in which the first terminal is formed, and a second region, in which the third terminal is formed, and
the second alignment mark is formed at a position corresponding to the first alignment mark.

6. The mounting structure according to claim 1,
wherein the first substrate includes a third terminal located adjacent to the first terminal and a fifth terminal located adjacent to the third terminal,
the second substrate includes a fourth terminal located adjacent to the second terminal and a sixth terminal located adjacent to the fourth terminal,
the first alignment mark is formed so as to span over a first region, in which the first terminal is formed, and a third region, in which the fifth terminal is formed, and the second alignment mark is formed so as to span over a third region, in which the second terminal is formed, and a fourth region, in which the sixth terminal is formed.

7. The mounting structure according to claim 1,
wherein the first alignment mark and the second alignment mark each include a positioning portion with respect to a first direction.

8. The mounting structure according to claim 7,
wherein the first alignment mark and the second alignment mark each include:
the positioning portion with respect to the first direction; and
a positioning portion with respect to a second direction intersecting the first direction.

9. The mounting structure according to claim 1,
wherein the first alignment mark is formed by partially cutting away the first terminal, and
the second alignment mark is a part of a conductive layer constituting the second terminal, and formed by cutting away a peripheral region of the part of the conductive layer.

10. The mounting structure according to claim 1, wherein each substrate includes a plurality of terminals including a terminal that is wider than other terminals in the plurality of terminals, and for each substrate:
the alignment mark is formed in the wider terminal.

11. The mounting structure according to claim 10,
wherein the wider terminal is assigned to a power source.

12. The mounting structure according to claim 1,
wherein at least one of the first substrate and the second substrate is light-transmissive.

13. An electro-optical apparatus comprising:
a first substrate having an electro-optical element mounted thereon; and
a second substrate electrically connected to the first substrate,
wherein the first substrate includes a first terminal and a first alignment mark formed by partially cutting away the first terminal,
the second substrate includes a second terminal and a second alignment mark formed by partially cutting away the second terminal, and
the first terminal and the second terminal are electrically connected to each other by being relatively positioned with respect to each other using the first alignment mark and the second alignment mark.

14. The electro-optical apparatus according to claim 13,
wherein the first substrate and the second substrate each include a group of terminals aligned in a first direction,
for each substrate, the alignment mark is provided in a terminal at one of two ends of the respective group of terminals,
at least one of the terminals at the ends on the first substrate serves as the first terminal, and
at least one of the terminals at the ends on the second substrate serves as the second terminal.

15. The electro-optical apparatus according to claim 13,
wherein the first substrate includes a third terminal located adjacent to the first terminal,
the first alignment mark is formed in a portion of the first terminal near the third terminal, and
the second alignment mark is formed at a position corresponding to the first alignment mark.

16. The electro-optical apparatus according to claim 13,
wherein the first alignment mark is formed in a region in which two or more terminals are formed, and the second alignment mark is formed at a position corresponding to the first alignment mark.

17. The electro-optical apparatus according to claim 13, wherein the first alignment mark and the second alignment mark each include a positioning portion with respect to a first direction.

18. The electro-optical apparatus according to claim 17, wherein the first alignment mark and the second alignment mark each include:

the positioning portion with respect to the first direction; and a positioning portion with respect to a second direction intersecting the first direction.

19. The electro-optical apparatus according to claim 13, wherein the electro-optical element may be one of an organic electroluminescence element, a liquid crystal element, and an electrophoretic element.

20. An electronic apparatus comprising the electro-optical apparatus according to claim 13.

* * * * *